United States Patent
Chen et al.

(10) Patent No.: US 8,722,529 B2
(45) Date of Patent: May 13, 2014

(54) DOUBLE SOLID METAL PAD WITH REDUCED AREA

(71) Applicant: Taiwan Semiconductor Manufacturing Company, Ltd., Hsin-Chu (TW)

(72) Inventors: Hsien-Wei Chen, Hsin-Chu (TW); Yu-Wen Liu, Taipei (TW); Hao-Yi Tsai, Hsin-Chu (TW); Shin-Puu Jeng, Hsin-Chu (TW); Ying-Ju Chen, Tuku Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/058,862

(22) Filed: Oct. 21, 2013

(65) Prior Publication Data

US 2014/0045327 A1 Feb. 13, 2014

Related U.S. Application Data

(63) Continuation of application No. 12/272,501, filed on Nov. 17, 2008, now Pat. No. 8,581,423.

(51) Int. Cl.
H01L 21/44 (2006.01)

(52) U.S. Cl.
USPC ...... 438/614; 438/612; 438/617; 257/E23.02; 257/781; 257/786

(58) Field of Classification Search
CPC .............................. H01L 21/44; H01L 21/441
USPC ............... 257/E23.02, E23.023, E23.04, 738, 257/758, 774–776, 780, 781, 784, 786; 438/612, 614, 617, 666
See application file for complete search history.

(56) References Cited

U.S. PATENT DOCUMENTS

| | | | |
|---|---|---|---|
| 5,923,088 A | 7/1999 | Shiue et al. | |
| 6,043,144 A | 3/2000 | Kuo | |
| 6,144,100 A | 11/2000 | Shen et al. | |
| 6,232,662 B1 | 5/2001 | Saran | |
| 6,261,944 B1 * | 7/2001 | Mehta et al. | 438/624 |
| 6,306,749 B1 | 10/2001 | Lin | |
| 6,313,537 B1 | 11/2001 | Lee et al. | |
| 6,448,641 B2 | 9/2002 | Ker et al. | |
| 6,455,943 B1 * | 9/2002 | Sheu et al. | 257/786 |
| 6,495,918 B1 | 12/2002 | Brintzinger | |

(Continued)

OTHER PUBLICATIONS

Chou, K.Y et al., "Active Circuits under Wire Bonding I/O Pads in 0.13 um Eight-Level Cu Metal, FSG Low-K Inter-Metal Dielectric CMOS Technology," IEEE Electron Device Letters, vol. 22, No. 10, Oct. 2001, pp. 466-468.

*Primary Examiner* — Chris Chu
(74) *Attorney, Agent, or Firm* — Slater and Matsil, L.L.P.

(57) ABSTRACT

An integrated circuit structure includes a bond pad; an Mtop pad located directly underlying the bond pad; an Mtop-1 pad having at least a portion directly underlying the Mtop pad, wherein at least one of the Mtop pad and the Mtop-1 pad has a horizontal dimension smaller than a horizontal dimension of the bond pad; a plurality of vias interconnecting the Mtop pad and the Mtop-1 pad; and a bond ball on the bond pad. Each of the Mtop pad and the Mtop-1 pad has positive enclosures to the bond ball in all horizontal directions.

18 Claims, 7 Drawing Sheets

(56) References Cited

U.S. PATENT DOCUMENTS

| | | | |
|---|---|---|---|
| 6,528,881 B1 | 3/2003 | Tsuboi | |
| 6,560,862 B1 | 5/2003 | Chen et al. | |
| 6,614,091 B1 | 9/2003 | Downey et al. | |
| 6,734,093 B1 | 5/2004 | Sabin et al. | |
| 6,756,671 B2 | 6/2004 | Lee et al. | |
| 6,822,329 B2 | 11/2004 | Varrot et al. | |
| 6,846,717 B2 | 1/2005 | Downey et al. | |
| 6,858,885 B2 | 2/2005 | Ebara | |
| 6,864,583 B2 | 3/2005 | Matsunaga et al. | |
| 6,900,541 B1 | 5/2005 | Wang et al. | |
| 6,908,841 B2 * | 6/2005 | Burrell et al. | 438/612 |
| 6,913,946 B2 | 7/2005 | Lin | |
| 6,998,638 B2 * | 2/2006 | Low et al. | 257/48 |
| 7,038,280 B2 | 5/2006 | Righter | |
| 7,115,985 B2 | 10/2006 | Antol et al. | |
| 7,157,734 B2 | 1/2007 | Tsao et al. | |
| 7,202,565 B2 | 4/2007 | Matsuura et al. | |
| 7,211,902 B2 | 5/2007 | Yamaha | |
| 7,230,338 B2 * | 6/2007 | Yuzawa et al. | 257/758 |
| 7,232,705 B2 | 6/2007 | Righter | |
| 7,247,943 B2 * | 7/2007 | Scheucher | 257/734 |
| 7,250,679 B2 | 7/2007 | Otsuka | |
| 7,253,531 B1 | 8/2007 | Huang et al. | |
| 7,276,797 B2 | 10/2007 | Fan et al. | |
| 7,281,231 B2 | 10/2007 | Kan et al. | |
| 7,315,072 B2 * | 1/2008 | Watanabe | 257/503 |
| 7,323,406 B2 | 1/2008 | Lim et al. | |
| 7,345,898 B2 | 3/2008 | Park et al. | |
| 7,391,114 B2 | 6/2008 | Mimura et al. | |
| 7,397,125 B2 * | 7/2008 | Oda | 257/758 |
| 7,397,127 B2 * | 7/2008 | Lin et al. | 257/773 |
| 7,420,283 B2 | 9/2008 | Ito | |
| 7,425,767 B2 | 9/2008 | Lin | |
| 7,429,528 B2 * | 9/2008 | Singh et al. | 438/666 |
| 7,453,158 B2 | 11/2008 | Singh et al. | |
| 7,498,680 B2 * | 3/2009 | Peng et al. | 257/784 |
| 7,521,812 B2 | 4/2009 | Lee et al. | |
| 7,622,364 B2 | 11/2009 | Adkisson et al. | |
| 7,714,357 B2 | 5/2010 | Hayashi et al. | |
| 7,863,652 B2 | 1/2011 | Toyoshima et al. | |
| 2002/0111009 A1 | 8/2002 | Huang et al. | |
| 2003/0030153 A1 | 2/2003 | Perry | |
| 2003/0047794 A1 | 3/2003 | Watanabe | |
| 2003/0127716 A1 | 7/2003 | Chou et al. | |
| 2003/0218259 A1 | 11/2003 | Chesire et al. | |
| 2004/0155352 A1 | 8/2004 | Ma | |
| 2004/0248359 A1 | 12/2004 | Hieda | |
| 2005/0023692 A1 | 2/2005 | Matsunaga et al. | |
| 2005/0116345 A1 | 6/2005 | Murtuza | |
| 2005/0258549 A1 | 11/2005 | Mathew | |
| 2006/0065969 A1 | 3/2006 | Antol et al. | |
| 2006/0071350 A1 | 4/2006 | Fan et al. | |
| 2006/0091566 A1 | 5/2006 | Yang et al. | |
| 2006/0154469 A1 | 7/2006 | Hess et al. | |
| 2006/0154470 A1 | 7/2006 | Pozder et al. | |
| 2006/0180946 A1 | 8/2006 | Chen | |
| 2006/0189125 A1 | 8/2006 | Kata et al. | |
| 2007/0018331 A1 | 1/2007 | Chen | |
| 2007/0205508 A1 | 9/2007 | Hsia et al. | |

* cited by examiner

DOUBLE SOLID METAL PAD WITH REDUCED AREA

This application is a continuation of U.S. patent application Ser. No. 12/272,501, entitled "Double Solid Metal Pad with Reduced Area," filed on Nov. 17, 2008, which application is incorporated herein by reference.

CROSS REFERENCES TO RELATED APPLICATION

This application relates to the following commonly-assigned U.S. patent application Ser. No. 11/409,297, filed Apr. 21, 2006, and entitled "Bond Pad Structure for Wire Bonding," which application is hereby incorporated herein by reference.

TECHNICAL FIELD

This invention relates generally to integrated circuits, and more particularly to the structure and formation methods of bonding structures of integrated circuits.

BACKGROUND

Integrated circuit (IC) chips are often electrically connected by wires (e.g., gold or aluminum wires) to a package substrate in a packaging assembly to provide external signal exchange. Such wires are typically wire bonded to bond pads formed on an IC chip using thermal compression and/or ultrasonic vibration. Wire bonding processes exert thermal and mechanical stresses on the bond pads and on the underlying layers and structure below the bond pads. The structures of the bond pads need to be able to sustain these stresses to ensure a quality bonding of the wires.

Currently, many processes use low-k and ultra low-k dielectric materials in inter-metal dielectric (IMD) layers to reduce RC delay and parasitic capacitances. The general trend in IMD designs is that the dielectric constant (k) of the IMD layers tends to decrease from low-k regime to ultra low-k regime. This, however, means that the IMD layers, in which metal lines and vias are formed, are more mechanically fragile. Further, the IMD layers may delaminate when under the stress applied by the wire bonding force. New bonding structures and methods are thus needed so that the IMD layers are not damaged, while at the same time the benefit of reduced RC delay resulting from the reduced k value is preserved.

SUMMARY OF THE INVENTION

In accordance with one aspect of the present invention, an integrated circuit structure includes a bond pad; an Mtop pad located directly underlying the bond pad; an Mtop-1 pad having at least a portion directly underlying the Mtop pad, wherein at least one of the Mtop pad and the Mtop-1 pad has a horizontal dimension smaller than a horizontal dimension of the bond pad; a plurality of vias interconnecting the Mtop pad and the Mtop-1 pad; and a bond ball on the bond pad. Each of the Mtop pad and the Mtop-1 pad has positive enclosures to the bond ball in all horizontal directions.

In accordance with another aspect of the present invention, an integrated circuit structure includes a bond pad; a bond ball bonded onto the bond pad; a wire attached to the bond ball; a first passivation layer underlying the bond pad; a first plurality of vias in the first passivation layer; and a double solid pad underlying the first passivation layer. The double solid pad includes an Mtop pad electrically coupled to the bond pad through the first plurality of vias, the Mtop pad being a solid conductive pad, wherein edges of the Mtop pad extend horizontally beyond respective edges of the bond ball by enclosures greater than about 2.4 µm; an Mtop-1 pad underlying the Mtop pad; and a second plurality of vias between and interconnecting the Mtop pad and the Mtop-1 pad. Edges of the Mtop-1 pad extend horizontally beyond respective edges of the bond ball by at least the enclosures. At least one of the Mtop pad and the Mtop-1 pad has a first horizontal dimension less than a respective second horizontal dimension of the bond pad.

In accordance with yet another aspect of the present invention, an integrated circuit structure includes a bond pad; a bond ball bonded onto the bond pad; a wire attached to the bond ball; a first passivation layer underlying the bond pad; and a double solid pad underlying the first passivation layer. The double solid pad includes an Mtop pad having at least a portion directly underlying the bond pad, wherein edges of the Mtop pad extend horizontally beyond respective edges of the bond ball by enclosures with positive values; an Mtop-1 pad having at least a portion directly underlying the Mtop pad, wherein the Mtop pad and the Mtop-1 pad are dummy pads; and a first plurality of vias between and interconnecting the Mtop pad and the Mtop-1 pad, wherein edges of the Mtop-1 pad extend horizontally beyond respective edges of the bond ball by at least the enclosures.

The advantageous features of the present invention include reduced chip area usage by the double solid pad without sacrificing the reliability of interconnect structures and bond pads.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
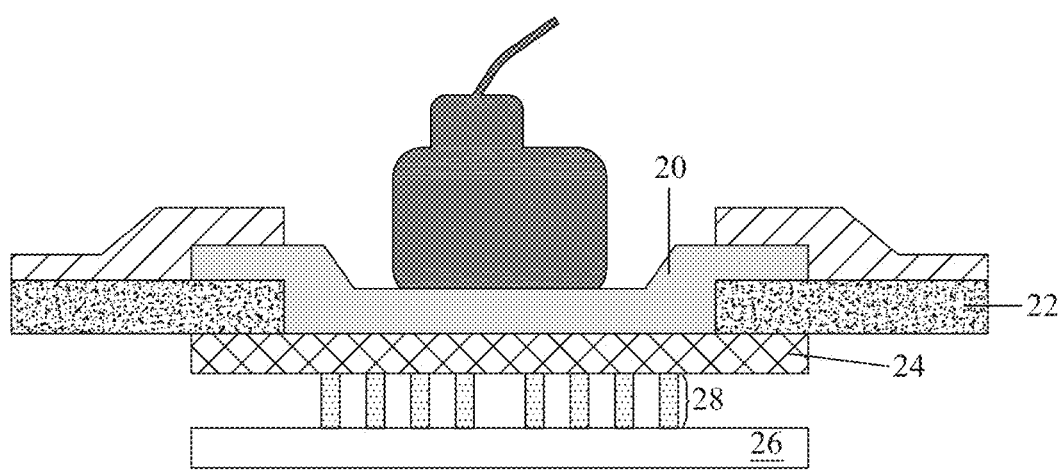
FIG. 1 illustrates a bonding structure having a double solid pad underlying a bond pad.

To solve the low-k dielectric damage problem incurred by the bonding force exerted during wire bonding, a bonding structure as shown in FIG. 1 may be provided. The bonding structure includes bond pad 20 formed in an opening in passivation layer 22. A double solid pad is formed directly underlying bond pad 20, wherein the double solid pad includes two metal pads 24 and 26 formed in two neighboring metallization layers. Metal pads 24 and 26 are interconnected by a plurality of vias 28, and hence metal pads 24, 26 and vias 28 form an integrated structure that may distribute the force applied on bond pad 20 during the wire bonding. The double solid pad thus protects the underlying low-k dielectric layers and active circuits from the wire bonding force.

The bonding structure as shown in FIG. 1, however, requires two metallization layers to be used for forming the double solid pad. Due to the fact that bond pad 20 is typically relatively large, the chip area occupied by the double solid pad is also large. The significant chip area usage by the double solid pad is further worsened by the increasingly greater number of bond pads required in applications. A solution is thus required to maintain the protection provided by the double solid pad, while saving the chip area that may be used for routing. In subsequent paragraphs, embodiments of the present application providing such as solution are discussed. Throughout the various views and illustrative embodiments of the present invention, like reference numbers are used to designate like elements.

Figure 2A:
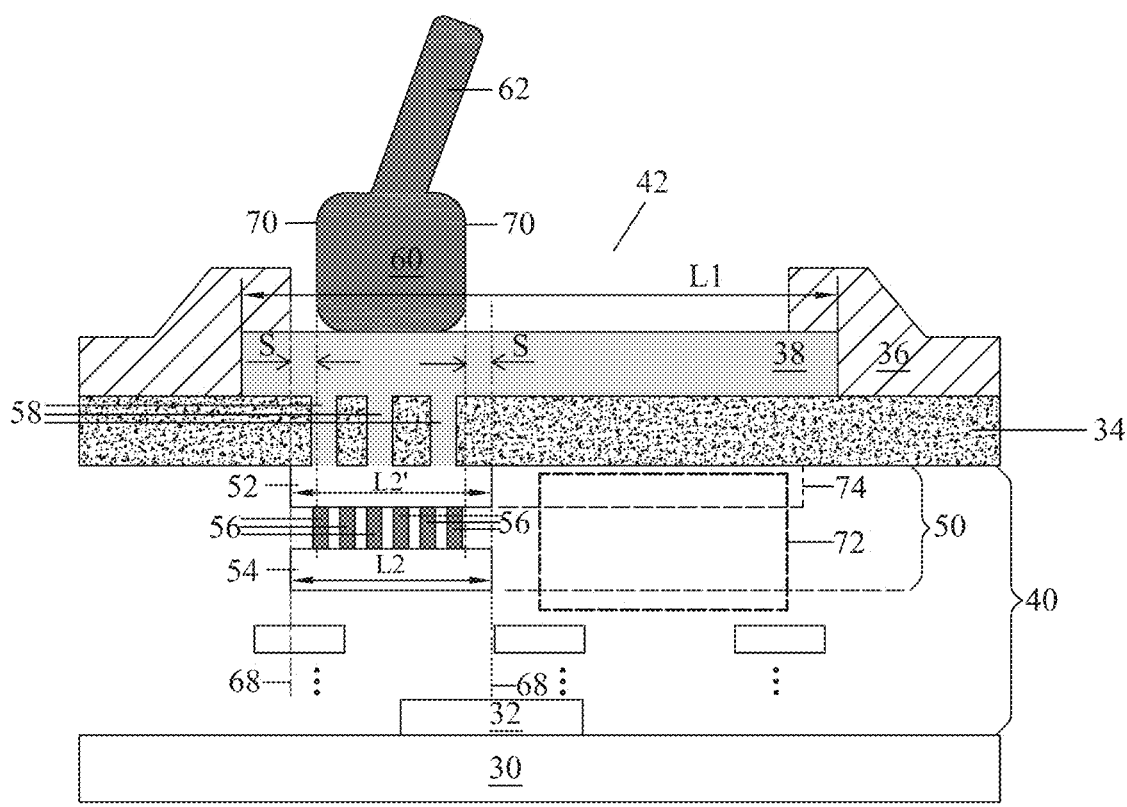
FIGS. 2A through 2C are views of an embodiment of the present invention, in which a double solid pad has a horizontal dimension less than a horizontal dimension of an overlying bond pad.

FIGS. 2A though 2C illustrate an embodiment of the present invention. FIG. 2A illustrates a cross-sectional view showing substrate 30, on which active circuit 32 is formed. Preferably, substrate 30 is a semiconductor substrate formed of commonly used semiconductor materials such as silicon, silicon germanium, or the like. Active circuit 32 may include complementary metal-oxide-semiconductor (CMOS) transistors, resistors, capacitors, and the like. For simplicity, substrate 30 and active circuit 32 are not shown in subsequent figures, although they are provided in each of the figures.

Passivation layers 34 and 36 are formed over substrate 30, and also over interconnect structure 40. Passivation layers 34 and 36 are commonly referred to in the art as being passivation-1 and passivation-2, respectively, and may be formed of materials such as silicon oxide, silicon nitride, un-doped silicate glass (USG), and/or multi-layers thereof. Bond pad 38 is formed over passivation layer 34. Further, bond pad 38 is in passivation layer 36 and exposed through opening 42 in passivation layer 36. Bond pad 38 may be formed of a metallic material such as aluminum, copper, silver, gold, nickel, tungsten, alloys thereof, and/or multi-layers thereof. Bond pad 38 may be electrically connected to active circuit 32, for example, through double solid pad 50 or other interconnections.

Interconnect structure 40 includes a plurality of metallization layers comprising metal lines and vias, and is used to interconnect portions of active circuit 32, and to connect active circuit 32 to bond pad 38. The metallization layers include top dielectric layers in which pads 52 and 54 are formed, and the top dielectric layers may be formed of un-doped silicate glass or low-k dielectric materials. In the two top metallization layers of the interconnect structure, which are referred to as layers Mtop and Mtop-1, double solid pad 50 is formed. Double solid pad 50 includes Mtop pad 52, Mtop-1 pad 54, and a plurality of vias 56 connecting pads 52 and 54. Mtop pad 52, Mtop-1 pad 54, and vias 56 may be formed of copper, tungsten, or other metals, and may be formed using dual damascene or single damascene processes. Alternatively, they may be formed by depositing a metal layer, and etching the metal layer. Double solid pad 50 is electrically connected to bond pad 38 through via(s) 58, which are formed in passivation layer 34.

A wire bond is made to electrically connect to bond pad 38. The wire bond includes bond ball 60 and the connecting wire 62. Bond ball 60 has a greater diameter than wire 62 as a result of the bonding. As is known in the art, bond ball 60 and wire 62 may be formed of gold, aluminum, or the like. Through bond ball 60, bond wire 62 is electrically connected to bond pad 38, and further to the underlying active circuit 32.

In the preferred embodiment of the present invention, bond pad 38 has a horizontal dimension L1, which is measured in a plane (and hence all directions in the plane are referred to as in-plane directions hereinafter) parallel to the surface of substrate 30. Mtop pad 52 and Mtop-1 pad 54 have horizontal dimension L2' and L2, respectively. Dimensions L1, L2, and L2' may be lengths or widths. In an embodiment, Mtop pad 52 and Mtop-1 pad 54 are fully overlapping and aligned to each other, and hence all edges of Mtop pad 52 may be substantially co-terminus with the respective edges of Mtop-1 pad 54. Preferably, at least one, and possibly both, of horizontal dimensions L2 and L2' are less than horizontal dimension L1. In an embodiment of the present invention, horizontal dimensions L2 and L2' may be less than about 90 percent, or even about 50 percent, of horizontal dimension L1. Further, double solid pad 50 is directly underlying, and vertically aligned to bond ball 60. All edges 68 of double solid pad 50 (including both the edges of Mtop pad 52 and the Mtop-1 pad 54) extend beyond edges 70 of bond ball 60 by distance S (referred to as enclosure hereinafter) greater than about 2.4 µm, and more preferably greater than about 4 µm, and even more preferably between about 4 µm and 6 µm. Accordingly, no edge of bond ball 60 is horizontally aligned to, or extends beyond, the respective edge of double solid pad 50. The significance of the enclosure S is discussed in subsequent paragraphs.

Figure 2B:
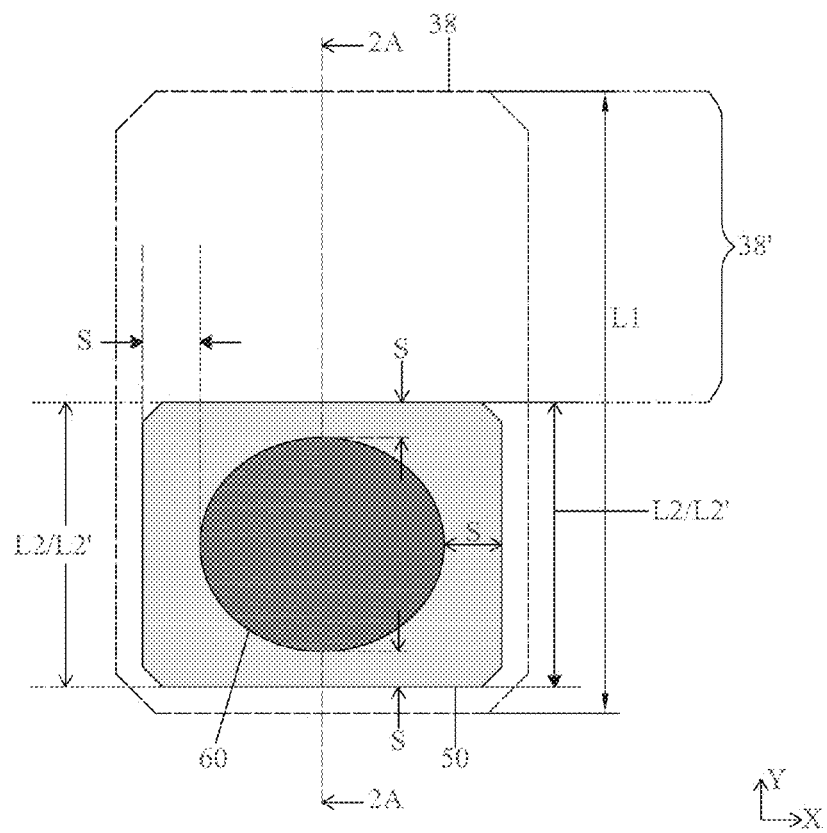
Figure 2C:
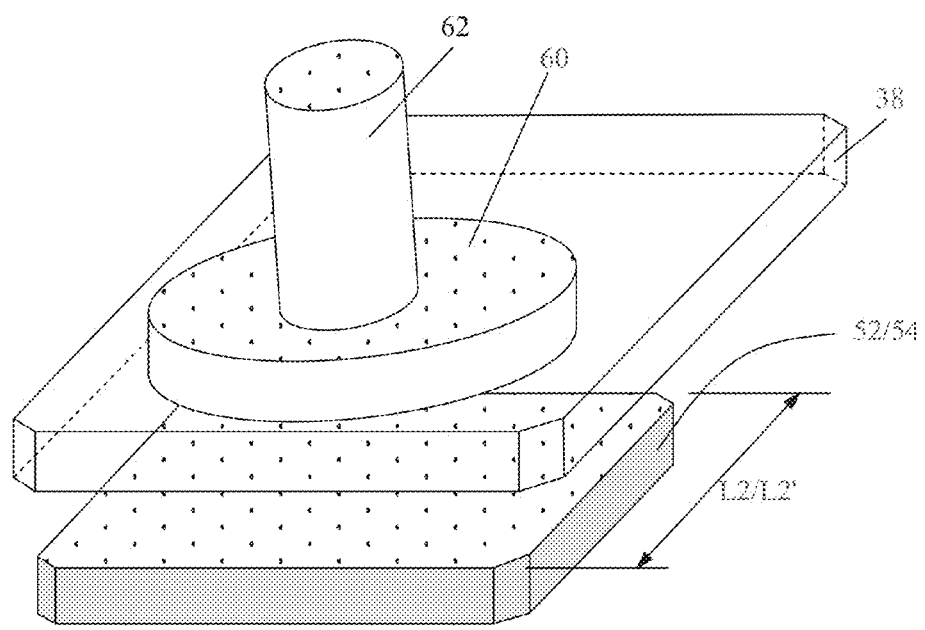

FIG. 2B illustrates an exemplary top view of the structure shown in FIG. 2A, wherein the cross-sectional view of FIG. 2A is taken along a plane crossing line 2A-2A in FIG. 2B. In an embodiment, as shown in FIGS. 2A through 2C, double solid pad 50 overlaps about a half of bond pad 38. In other embodiments, double solid pad 50 may overlap substantially an entirety of bond pad 38. It is noted that the preferred positive enclosure S exists in all in-plane directions, including +X, −X, +Y, and −Y directions, and even in in-plane directions not parallel to X and Y directions. Please note that bond pad 38 includes region 38' that is not overlapped by double solid pad 50. Region 38' may be used for probe pins to contact bond pad 38 during probe test. Accordingly, horizontal dimensions L2/L2' may be less than about 50 percent of dimension L1. Even if double solid pad 50 only overlaps about a half of bond pad region 38', optimum results can still be obtained, as will be discussed in subsequent paragraphs. FIG. 2C illustrates a perspective view of the structure shown in FIGS. 2A and 2B.

Figure 3A:
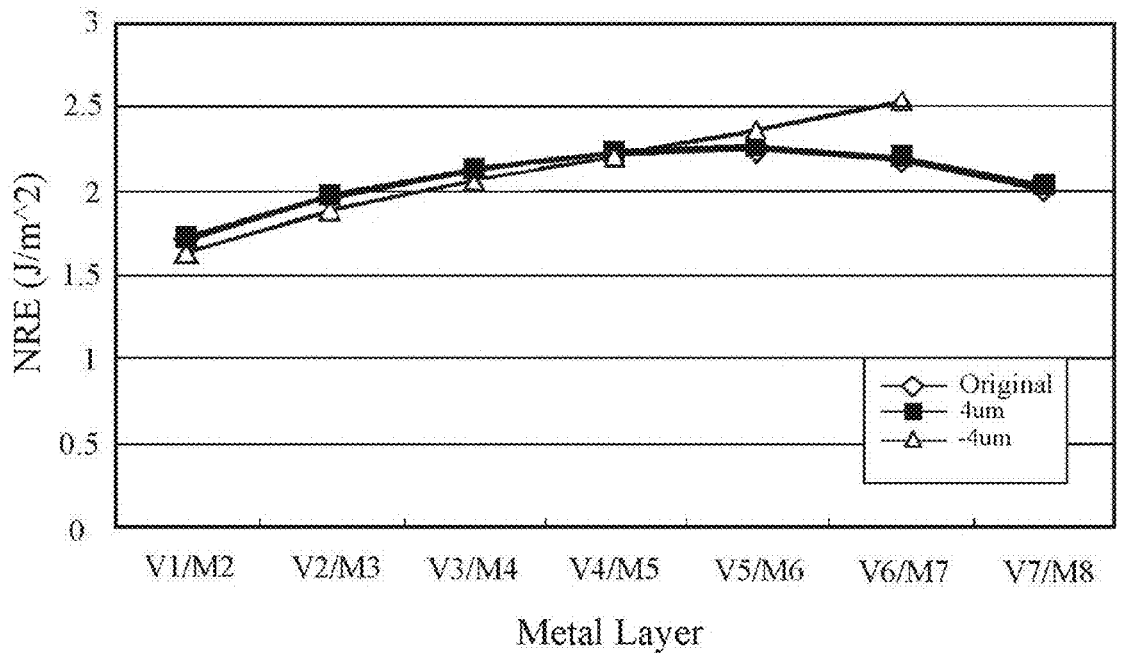
FIG. 3A illustrates simulation results indicating node release energies as a function of the metal layers.
Figure 3B:
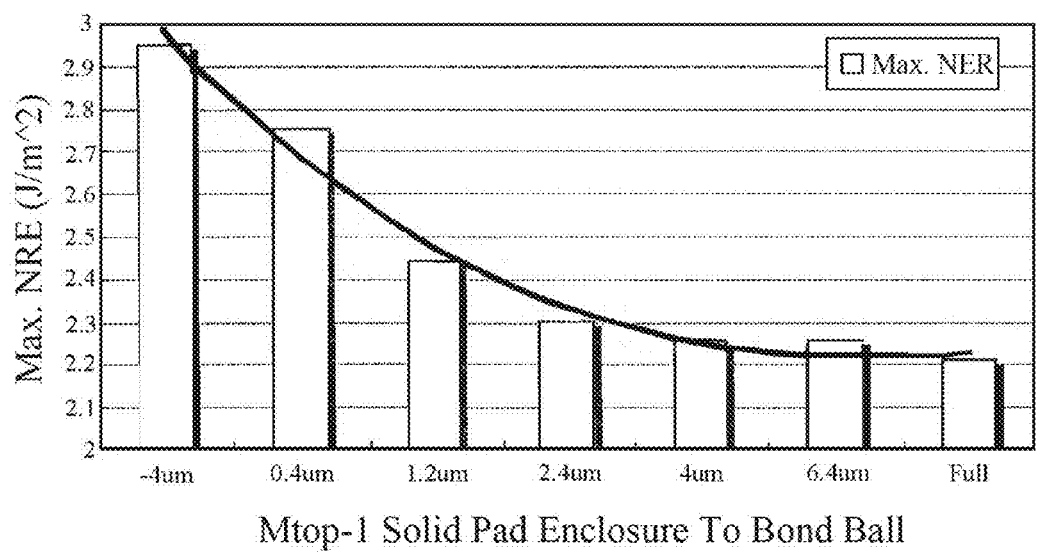
FIG. 3B illustrates simulation results indicating node release energies as a function of the enclosures of double solid pad to bond ball.

The significance of the required enclosure S (refer to FIG. 2B) is explained using the simulation results shown in FIGS. 3A and 3B. When a wire bonding is performed, to detach the wire from bond pad 38, a force is asserted to pull the wire away from bond pad 38. The force is also exerted to the underlying metallization layers M1 (the bottom metallization layer in interconnect structure 40 as shown in FIG. 2A, M1 is not shown) through Mtop. Simulations were made to study the node release energy (NRE) in each of the metallization layers. An NRE of a feature is equal to the force applied on the feature times the displacement of the feature. Greater node release energies indicate greater displacements of the feature, and hence greater possibility of delamination. The simulation results are illustrated in FIG. 3A, wherein the Y-axis indicates the node release energies, and the X-axis indicates the metallization layers. The simulation results have revealed that metallization V4/M5 (meaning via level 4 and metallization layer 5) and neighboring layers are the weakest layers with the greatest node release energies.

A further simulation is then performed to V4/M5 to study the relationship between the enclosure S (refer to FIG. 2A) and the node release energies of the weakest layers. The results are shown in FIG. 3B. The results have revealed that if the enclosure S is negative, meaning edges 70 of bond ball 60 extend beyond the edges of double solid pad 50 (refer to FIG. 2A), the node release energies have high values, indicating high possibilities of dielectric layer delamination. When the enclosure S increases to positive values, the NRE reduces. However, the reduction in node release energies starts to saturate when enclosure S is greater than about 2.4 μm, and substantially fully saturate when enclosure S is greater than about 4 μm. Further increasing the enclosure S results in no reduction in node release energies. FIG. 3B indicates that the size of double solid pad 50 strongly affects the reliability of the wire bonding. However, contrary to the conventional wisdom, the optimum size of double solid pad 50 does not have to be as big as the overlying bond pad 38. Instead, the optimum size of double solid pad 50 is strongly co-related to the size of bond ball 60.

Referring back to FIG. 2A, advantageously, by reducing the size of double solid pad 50, chip area 72 is freed, and can be used for routing metal lines. In alternative embodiments, Mtop pad 52 and Mtop-1 pad 54 do not have the same size. For example, the dotted line 74 shows where Mtop pad 52 can expand to, wherein the expanded Mtop pad 52 has a horizontal dimension L2' greater than horizontal dimension L2 of Mtop-1 pad 54. The horizontal dimension L2' may be substantially equal to, or less than, the horizontal dimension L1 of bond pad 38. If viewed from top, the difference between horizontal dimensions L2 and L2' may exist in only one direction (either X or Y direction, as shown in FIG. 2B), or in both X and Y directions. Even if horizontal dimensions L2 and L2' are not equal to each other, both Mtop pad 52 and Mtop-1 pad 54 still needs to have adequate positive enclosure S, as discussed in the preceding paragraphs.

Figure 4:
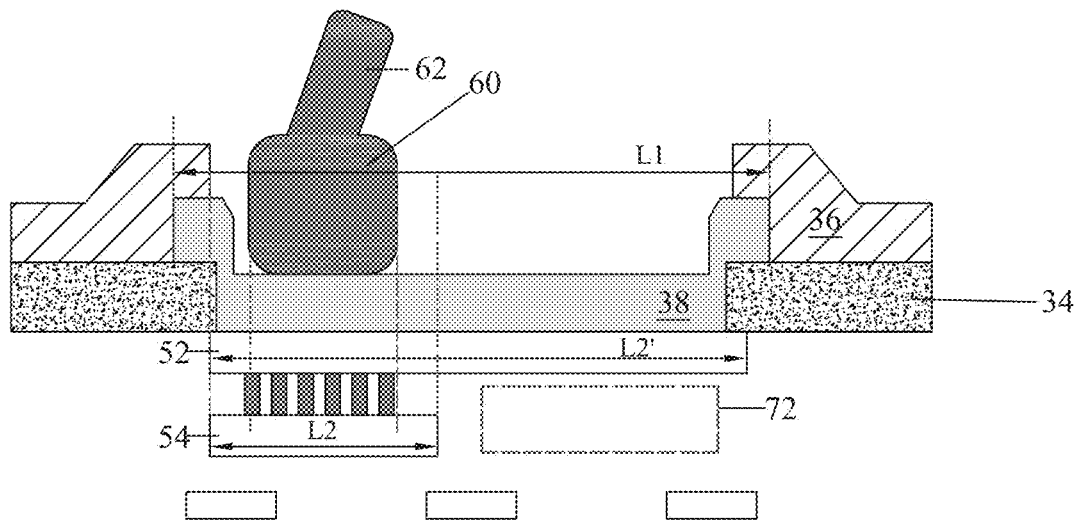
FIGS. 4 through 7 are alternative embodiments of the present invention.
Figure 5:
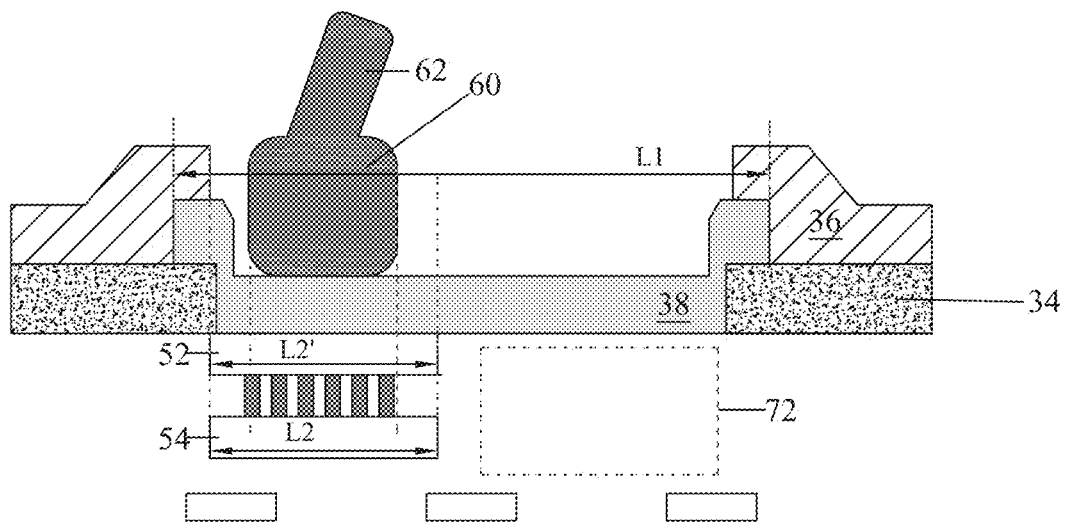

FIGS. 4 and 5 illustrate alternative embodiments of the present invention. In these embodiments, bond pad 38, instead of being formed overlying passivation layer 34 and connected to Mtop pad 52 through vias, is formed with at least a portion in passivation layer 34. In this case, the horizontal dimension L2' of Mtop pad 52 may be close to the horizontal dimension L1 of bond pad 38, as shown in FIG. 4, or substantially equal to horizontal dimension L2 of Mtop-1 pad 54. Again, in the embodiments shown in FIGS. 4, 5 and the subsequently shown figures, both Mtop pad 52 and Mtop-1 pad 54 need to maintain the preferred positive enclosure S.

Figure 6:
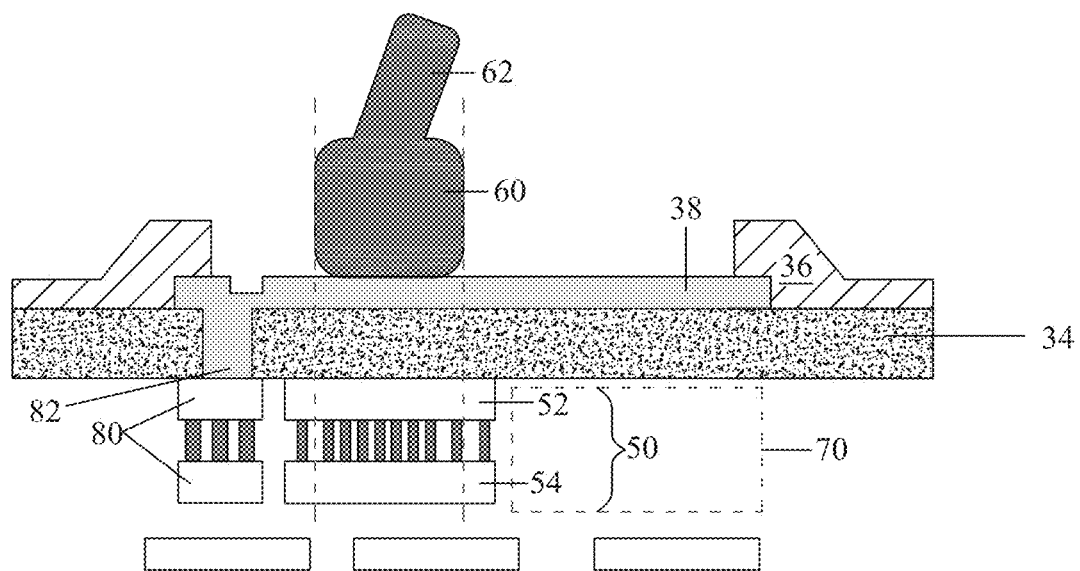
Figure 7:
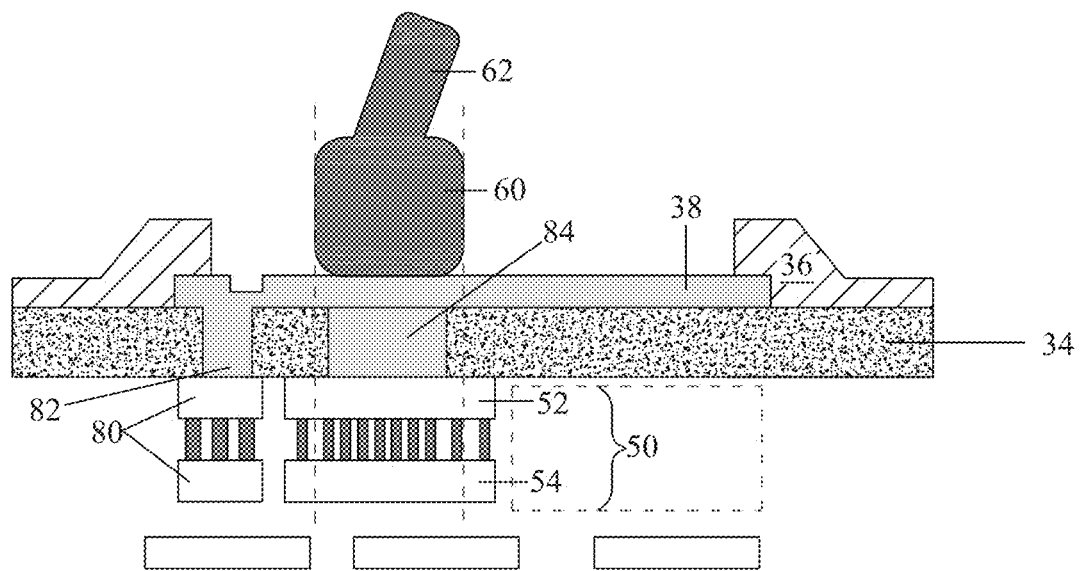

FIGS. 6 and 7 illustrate embodiments in which double solid pad 50, instead of electrically connecting bond pad 38 to active circuit 32 (not shown in FIGS. 6 and 7, refer to FIG. 2A), are dummy pads with no electrical connection to any underlying features and active circuit 32. In other words, the dummy pads have no current flowing through them, although they may or may not be electrically connected to bond pad 38. In FIG. 6, the electrical connection between active circuit 32 and bond pad 38 is made through metal pads 80, which may also form a double solid pad. Metal pads 80 conduct the current to/from bond pad 38. Double solid pad 50 is not connected to bond pad 38. Alternatively, as shown in FIG. 7, double solid pad 50 is connected to bond pad 38 through via(s) 84. However, there is no via directly underlying and connecting double solid pad 50 to active circuit 32, and no current flows through double solid pad 50.

Figure 8A:
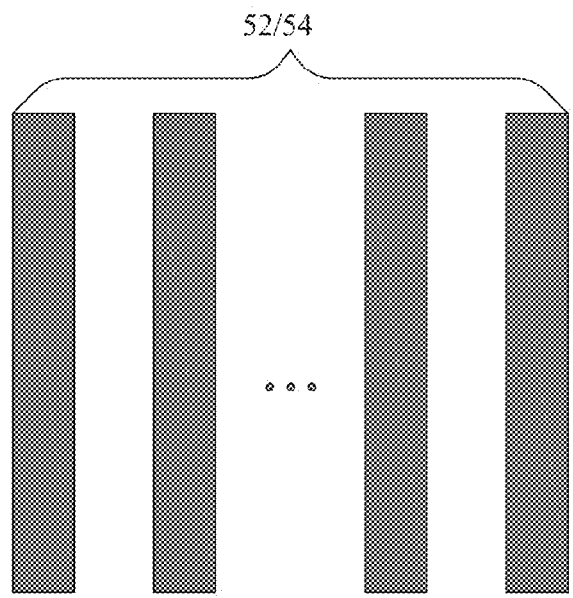
FIGS. 8A and 8B are top views of exemplary double solid pads.
Figure 8B:
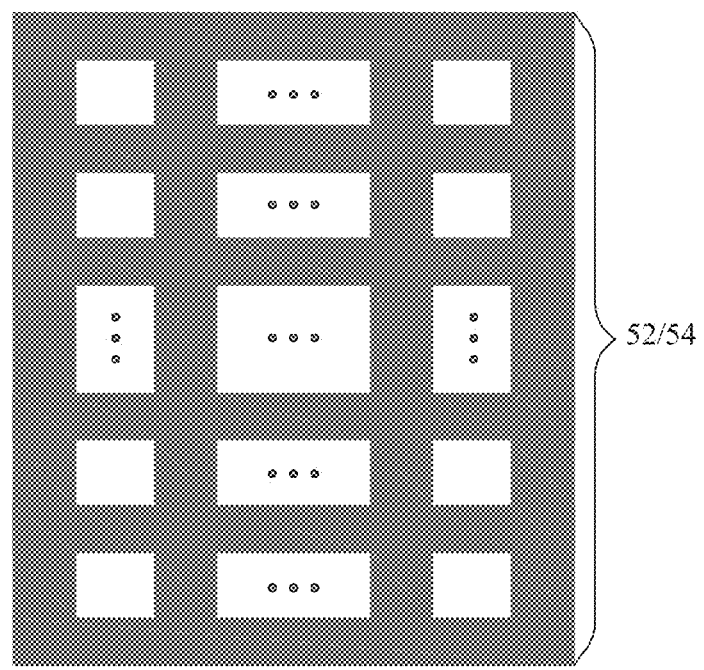

Although throughout the description, the term "double solid pad" is used to refer to Mtop pad 52 and Mtop-1 pad 54, in alternative embodiments, Mtop pad 52 and Mtop-1 pad 54 do not have to be solid in top views. FIGS. 8A and 8B are two possible top views of Mtop pad 52 and Mtop-1 pad 54. In FIG. 8A, Mtop pad 52 or Mtop-1 pad 54 is slotted. In this case, the electrical interconnection between the discrete portions of the slotted one of Mtop pad 52 and Mtop-1 pad 54 may be made through the other one of Mtop pad 52 and Mtop-1 pad 54, which in this case, is preferably solid. Alternatively, as shown in FIG. 8B, one or both of Mtop pad 52 and Mtop-1 pad 54 may form a grid(s).

The embodiments of the present invention have several advantageous features. First, by reducing the size of at least one, and possibly both of the Mtop pad and Mtop-1 pad, chip area is saved. The reduction in the usage of the chip area, however, causes no degradation in the reliability of wire bonding structure when adequate enclosure is enforced. Further, the embodiments of the present invention require no additional lithography steps.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
   performing a wire bonding on a bond pad of an integrated circuit structure, wherein the integrated circuit structure comprises:
   a bond pad;
   an Mtop pad located directly underlying the bond pad;
   an Mtop-1 pad having at least a portion directly underlying the Mtop pad, wherein the Mtop pad and the Mtop-1 pad are solid conductive pads electrically coupled to the bond pad, and wherein at least one of the Mtop pad and the Mtop-1 pad has a horizontal dimension smaller than a horizontal dimension of the bond pad; and
   a plurality of vias interconnecting the Mtop pad and the Mtop-1 pad, wherein the wire bonding forms a bond ball on the bond pad, and wherein each of the Mtop pad and the Mtop-1 pad extends beyond boundaries of the bond ball.

2. The method of claim 1 further comprising forming the integrated circuit structure comprising:
   forming the Mtop-1 pad;
   forming the plurality of vias over and connected to the Mtop-1 pad; and
   forming the Mtop pad over and connected to the plurality of vias.

3. The method of claim 1, wherein each of the Mtop pad and the Mtop-1 pad extends beyond the boundaries of the bond ball by a distance greater than about 2.4 μm.

4. The method of claim 3, wherein the distance is greater than about 4 μm.

5. The method of claim 1, wherein each of the Mtop pad and the Mtop-1 pad extends beyond the boundaries of the bond ball in opposite directions that are parallel to a top surface of the Mtop pad.

6. The method of claim 1 further comprising:
forming a first passivation layer over the Mtop pad, wherein the bond pad has at least a portion in the first passivation layer; and
forming a second passivation layer over the first passivation layer, wherein the second passivation layer comprises an opening exposing the bond pad.

7. The method of claim 1 further comprising:
forming a first passivation layer over the Mtop pad, wherein the bond pad is over the first passivation layer; and
forming a second passivation layer over the first passivation layer, wherein the bond pad is in the second passivation layer.

8. The method of claim 7, wherein the Mtop pad and the Mtop-1 pad are dummy pads and are electrically connected to the bond pad, and wherein the Mtop pad and the Mtop-1 pad are configured not to pass currents flowing through the bond pad.

9. The method of claim 7, wherein the Mtop pad and the Mtop-1 pad are configured to pass currents flowing through the bond pad.

10. A method comprising:
forming a double solid pad comprising:
forming an Mtop-1 pad;
forming an Mtop pad overlying the Mtop-1 pad, the Mtop pad being a solid conductive pad; and
Forming a first plurality of vias between and interconnecting the Mtop pad and the Mtop-1 pad;
forming a first passivation layer overlying the Mtop pad;
forming a second plurality of vias in the first passivation layer;
forming a bond pad overlying the first passivation layer, wherein the bond pad is electrically coupled to the Mtop pad through the first plurality of vias, and wherein at least one of the Mtop pad and the Mtop-1 pad has a first horizontal dimension less than a respective second horizontal dimension of the bond pad; and
performing a wire bonding on the bond pad to form a bond ball on the bond pad, wherein edges of the Mtop pad extend horizontally beyond respective edges of the bond ball by first distances greater than about 2.4 μm, and wherein edges of the Mtop-1 pad extend horizontally beyond respective edges of the bond ball by second distances equal to or greater than the first distances.

11. The method of claim 10, wherein the first horizontal dimension is less than about a half of the second horizontal dimension.

12. The method of claim 10, wherein each of the Mtop pad and the Mtop-1 pad has at least a horizontal dimension less than a respective horizontal dimension of the bond pad.

13. The method of claim 12, wherein all edges of the Mtop pad are co-terminus with respective edges of the Mtop-1 pad.

14. The method of claim 10, wherein the first distances are greater than about 4 μm.

15. A method comprising:
forming a double solid pad comprising:
forming an Mtop-1 pad;
forming an Mtop pad overlapping at least a portion of the Mtop-1 pad, wherein the Mtop pad and the Mtop-1 pad are dummy pads; and
forming a first plurality of vias between and interconnecting the Mtop pad and the Mtop-1 pad;
forming a first passivation layer overlying the double solid pad;
forming a bond pad overlying the first passivation layer; and
bonding a metal wire on the bond pad to form a bond ball on the bond pad, and a metal wire attached to the bond ball, wherein edges of the Mtop pad extend horizontally beyond respective edges of the bond ball by enclosures with positive values, and wherein edges of the Mtop-1 pad extend horizontally beyond respective edges of the bond ball by at least the enclosures.

16. The method of claim 15 further comprising forming a second plurality of vias in the first passivation layer and interconnecting the bond pad and the Mtop pad.

17. The method of claim 15, wherein the bond pad and the Mtop pad are electrically disconnected.

18. The method of claim 15, wherein the enclosures are greater than about 2.4 μm.

* * * * *